United States Patent [19]

Topich, deceased

[11] Patent Number: 4,754,432
[45] Date of Patent: Jun. 28, 1988

[54] NONVOLATILE MULTICONFIGURABLE CIRCUIT

[75] Inventor: James A. Topich, deceased, late of Centerville, Ohio, by Susan K. Topich, executrix

[73] Assignee: NCR Corporation, Dayton, Ohio

[21] Appl. No.: 889,543

[22] Filed: Jul. 25, 1986

[51] Int. Cl.[4] .............................................. G11C 11/34
[52] U.S. Cl. .................................... 365/185; 365/228; 377/67
[58] Field of Search ............... 365/185, 189, 228, 240, 365/78, 77; 377/79, 67

[56] References Cited

U.S. PATENT DOCUMENTS

| | | | |
|---|---|---|---|
| 3,831,155 | 8/1974 | Tamaru et al. | 365/228 |
| 4,512,029 | 4/1985 | Brice | 307/279 |
| 4,683,554 | 7/1987 | Lockwood et al. | 365/185 |
| 4,686,652 | 8/1987 | Spence | 365/185 X |

Primary Examiner—Joseph A. Popek
Attorney, Agent, or Firm—Wilbert Hawk, Jr.; Casimer K. Salys

[57] ABSTRACT

A multiconfigurable integrated circuit having volatile and nonvolatile segments configured and interconnected so that data can be nonvolatilely entered and transferred at high frequency in the volatile segment, so that formerly entered data can be nonvolatilely stored while new data is entered and volatiley utilized, and so that previously stored nonvolatile data can be recalled and volatilely utilized. In one form, the circuit is comprised of a shift register stage selectively connectable to a nonvolatile memory cell structure. Interconnection of multiple circuits and the addition of analog switches creates electronic equivalents of DIP switches and various other multiple pole selectively controlled switching configurations.

12 Claims, 6 Drawing Sheets $T_{DS}$ – DATA SET UP TIME
$T_{DD}$ – DELAY FOR "DATA OUT"
$T_{DDB}$ – DELAY FOR "DATA OUT/"

$T_{PW}$ – "PROGRAM" PULSE WIDTH
$T_{PD}$ – "PROGRAM" TO "$V_{PP}$" DELAY
$T_{PF}$ – $V_{PP}$ RC FALL TIME CONSTANT
$T_{PR}$ – $V_{PP}$ RC RISE TIME CONSTANT

- $T_{RC}$ — "RECALL/" PULSE WIDTH
- $T_S$ — "SET/" PULSE WIDTH
- $T_{SD}$ — DELAY FROM "SET/" TO "DATA OUT"
- $T_{SDB}$ — DELAY FROM "SET/" TO "DATA OUT/"

SINGLE POLE DOUBLE THROW SWITCH

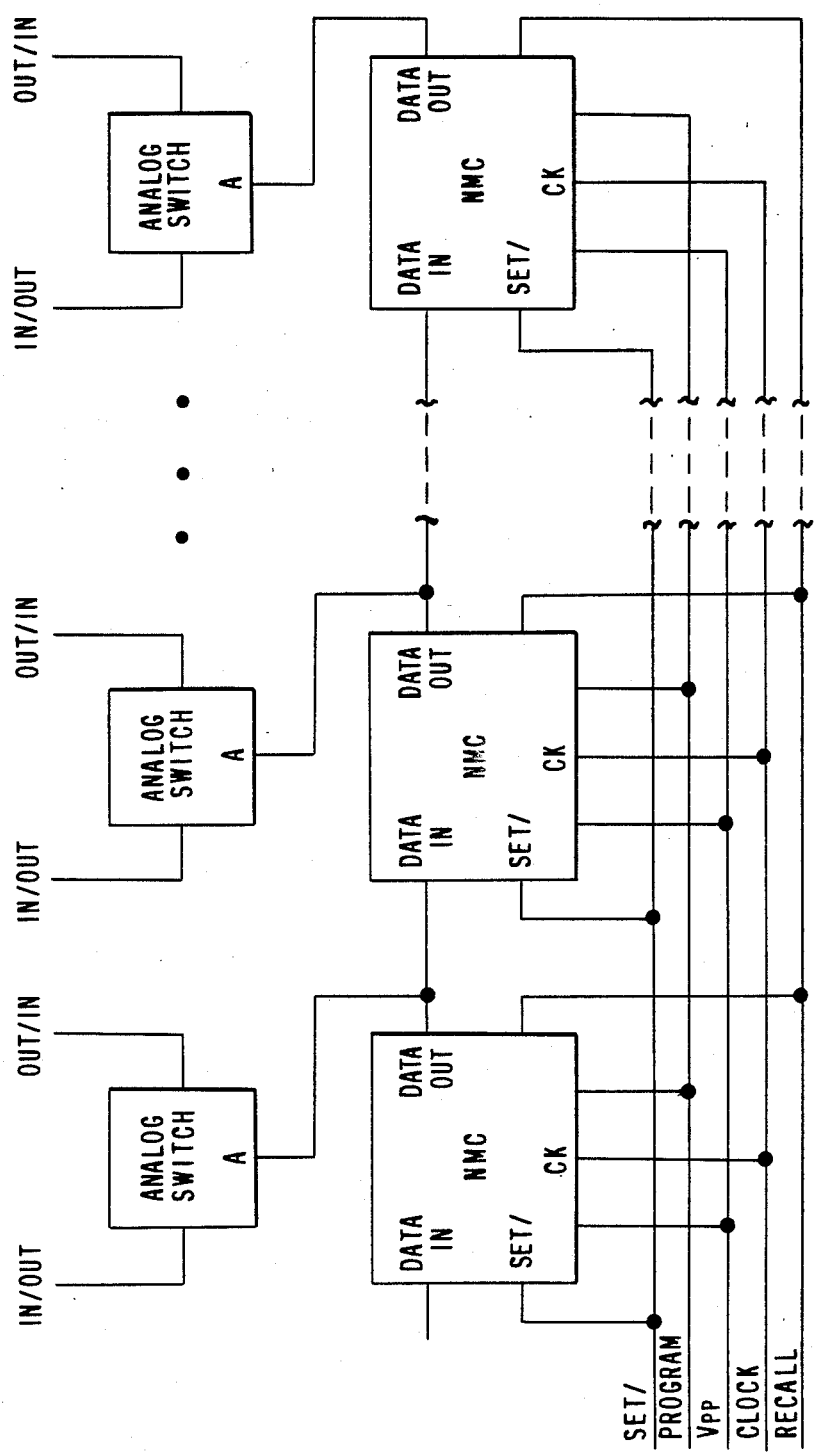
FIG. 6  DIP SWITCH EQUIVALENT

NONVOLATILE MULTICONFIGURABLE CIRCUIT

CROSS-REFERENCE TO RELATED APPLICATIONS

The present invention is related to U.S. Pat. No. 4,683,554 by inventors Lockwood et al. and assigned to the assignee of the present invention.

BRIEF SUMMARY

The present invention relates generally to an electronic circuit, and more particularly to an integrated circuit configured to combine the attributes of volatile and nonvolatile functional segments. The volatile segments of the circuit are suitably decoupled from the nonvolatile segments to enable high frequency operation using data which is entered from an external source or recalled from internal nonvolatile storage. As conceive and preferably implemented the composite is particularly suited for use in semicustom integrated circuit designs configured with computer aided design systems using cell library type standardized structures.

A preferred implementation of the present invention is comprised of two functional segments, which segments interact and may include upon occasion additional elements which provide commonly shared command signals and operating voltages. One volatile segment of such an embodiment includes a serial-in serial-out shift register stage having connections to provide data in signals, data out signals, clocking signals, reset signals, and means for coupling signals to and from the nonvolatile segment. For each such shift register stage circuit the embodiment also includes a nonvolatile circuit, which circuit is decoupled from the shift register during normal, high frequency, operation of the register, while subject to being coupled to the register when nonvolatile data is to be transferred, upon command, either to or from the register.

The transfer of data from nonvolatile storage into the shift register is accomplished relatively fast, while the writing of the nonvolatile segment with data from the shift register is comparatively slower and responsive to signals having elevated voltages and specified waveforms. In keeping with the evolving state of integrated circuit technology, the nonvolatile segment is a direct write design, namely one in which no erase mode is required, and the nonvolatile segment is preferably capable of being fabricated using a single polysilicon layer.

The nonvolatile multiconfigurable circuit contemplates the inclusion of a shared power-on recall element, for selectively recalling or refreshing the state of shift register, and a shared integrated circuit implementation of a program voltage generator and control suitable to allow nonvolatile programming responsive to a single command pulse.

The central features of the embodying nonvolatile multiconfigurable circuit are implemented using field effect transistors and floating gate nonvolatile technology in an integrated circuit suitable for miniturization as a single cell within a library. When so implemented, a multiplicity of the cells may be interconnected to perform switching and counting functions in a high frequency environment, while retaining the capability to selectively program and retrieve nonvolatile data. These and other features of the invention will be more clearly understood upon considering the ensuing detailed description.

DESCRIPTION OF THE DRAWINGS

FIG. 6 schematically depicts a multiplicity of nonvolatile multiconfigurable circuits connected to perform the function of a DIP switch.

DETAILED DESCRIPTION

Figure 1:
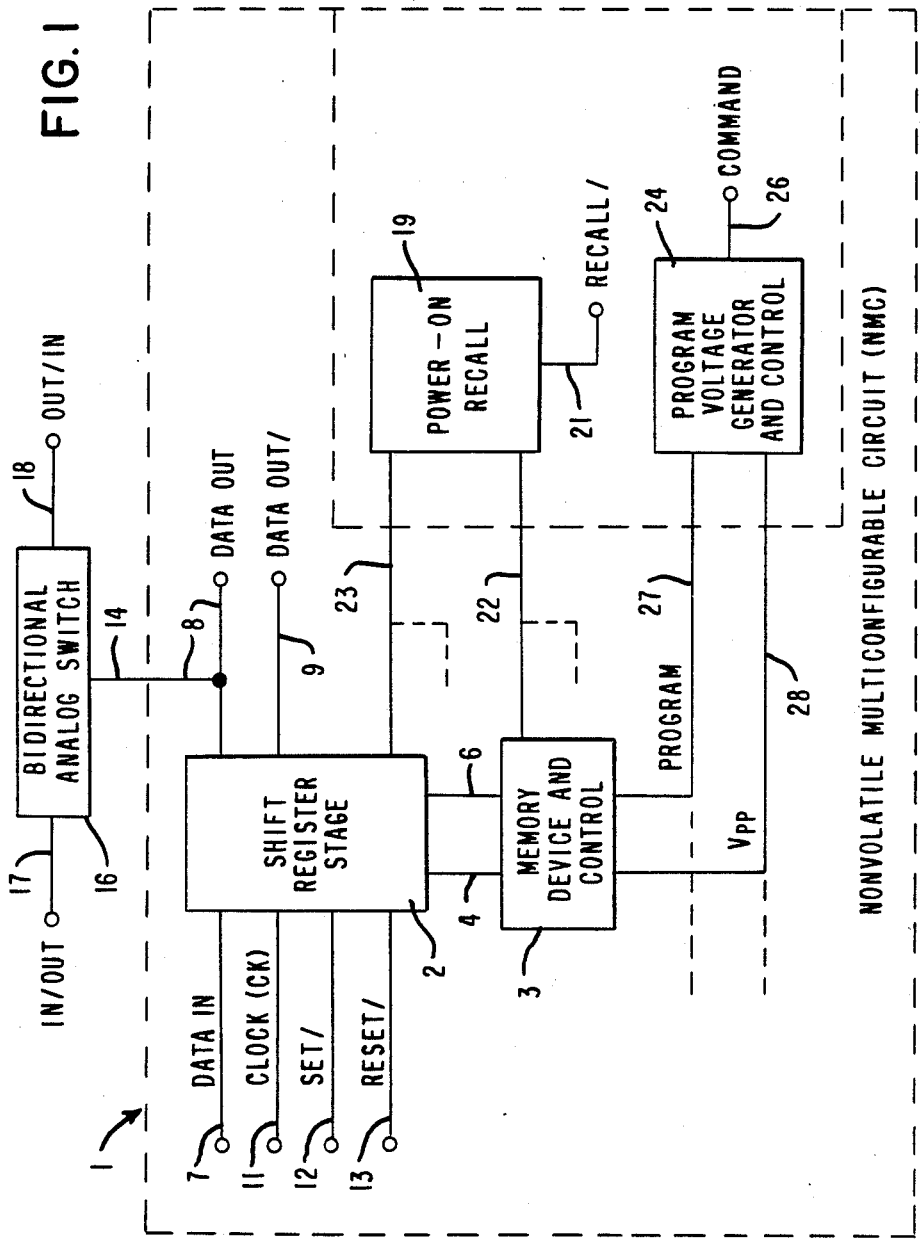
FIG. 1 is a functional block diagram of a preferred embodiment of a composite nonvolatile multiconfigurable circuit.

The benefits of combining the speed and flexibility of volatile circuits with the unpowered storage capabilities of nonvolatile circuits are commonly known and therefore frequently used on board level electronic products. In such applications the devices which perform the high frequency volatile and lower frequency nonvolatile functions are structurally distinct integrated circuits. With the present industry movement toward integrating board level products into a single, very large scale integrated circuit chips, the incompatibility of the fabrication processes used in the manufacture of the volatile and nonvolatile devices, in addition to the differences in operating voltages required, has made it difficult to apply in normal design practices nonvolatile technology to semicustom type single chip designs utilizing gate arrays or cell libraries.

Various mergers of nonvolatile functions with fundamentally volatile circuit elements appear in the technical publications. For instance, U.S. Pat. No. 3,831,155 teaches the configuration of a nonvolatile semiconductor shift register. Because this circuit is configured to store in nonvolatile form the data following each shift, the circuit is subject to relatively rapid retention degradation, and undoubtedly exhibits a relatively slow operating speed in view of the application of both an erase and a write cycle for each transfer of data through the register. The design in more recent U.S. Pat. No. 4,512,029 suffers similarly, but to a somewhat lesser extent because the circuit has been configured to minimize the number of nonvolatile write cycles. Another approach for combining nonvolatile functions with volatile circuit functions appears in recently issued U.S. Pat. No. 4,571,704. However, this circuit exhibits no volatile mode of operation aside and distinct from a recall of the nonvolatile programmed state. Some very recent activities in the technology to which the invention pertains are described in the article entitled "Found: The Final Link to the One-Chip System", which appeared in the Mar. 17, 1986 issue of *Electronics*, on pages 30-34. Although the article recognized the desirability of providing nonvolatile capability in a semicustom cell library design environment, the circuit arrangement proposed does not provide a high frequency volatile mode of operation, and further requires a fabrication process involving the deposition and patterning of two polysilicon layers. It is noted that the provision of a second polysilicon layer is required to create the nonvolatile devices on the integrated circuit chips.

The present invention merges operating concepts and structural technologies representative of volatile and nonvolatile integrated circuits to provide in the preferred context of a computer aided design cell library, the frequency capabilities of volatile devices, the ability to store data in nonvolatile form with no erase cycle and minimal endurance degradation, and an interface between the two, suitable for fabrication with a single polysilicon layer structure.

Figure 2:
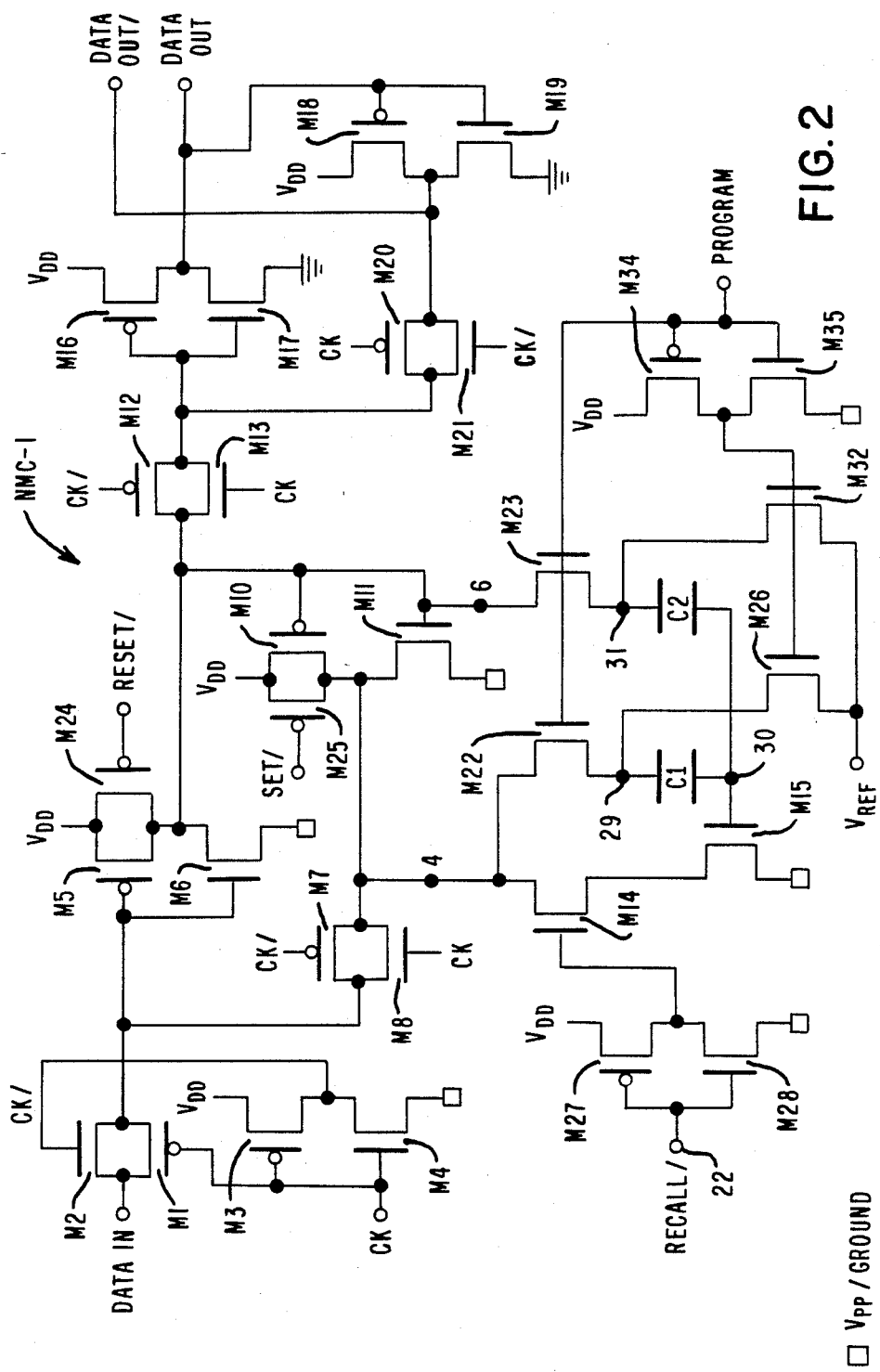
FIG. 2 is a schematic of a field effect transistor embodiment of the shift register stage and memory device and control functional blocks first depicted in FIG. 1.

The features of the invention can be more fully appreciated by considering a preferred embodiment thereof, as functionally illustrated in FIG. 1 and schematically depicted in FIG. 2 of the drawings. As shown in FIG. 1, the nonvolatile multiconfigurable circuit (NMC), generally at 1, is comprised of a serial-in serial-out shift register stage 2 connected to a memory device and control 3 by lines 4 and 6. Shift register stage 2 is conventional to the extent that data signals are received via data in connection 7 and following a clock cycle are provided as data out signals on data out and data out/-lines 8 and 9, respectively. As shown, shift register stage 2 also includes a clocking connection 11, as well as respective set/and reset/connections 12 and 13.

The transfer of data from nonvolatile memory device and control 3 to shift register stage 2 is responsive to control signals from power-on recall block 19. As is suggested by the title of block 19, its purpose is to provide the appropriate sequence of signals which will transfer data from memory device and control 3 to shift register stage 2. As presently embodied, power-on recall 19 is connected to memory device and control 3 by line 22 and to shift register stage 2 by line 23, in such a way that shift register stage 2 can first be preconditioned by a signal on line 23 and thereafter respond to the memory device in block 3 when connected in response to a control signal on line 22.

A program voltage generator and control block 24 is also depicted in FIG. 1 of the drawings, having as an input a command line 26 and as outputs program line 27 and program voltage (VPP) line 28. Program voltage generator and control block 24 provides the signals which program the nonvolatile memory device in block 3. According to the preferred embodiment, program voltage generator and control block 24 receives a write command pulse on line 26 and thereafter generates a timed program signal on line 27 and a relatively large amplitude, specified waveform program voltage VPP on line 28.

The dashed leftward projections of lines 27 and 28 represent that the signals may be generated elsewhere or commonly conveyed by lines 27 and 28 to other adjacent NMCs. The common usage of signals is equally applicable to those emanating from power-on recall block 19, in that these signals are, in most cases, common to multiple NMCs, including selective groupings thereof.

In an exemplary use of the NMC, the output of shift register stage 2, for example on line 14, controls the on/off state of bidirectional analog switch 16, so as to define an open/close state between in/out line 17 and out/in line 18 of switch 16 which corresponds to the logic state of the signal on data out line 8. With this configuration, the on/off state of switch 16 can be defined either by data shifted into register stage 2 or by data transferred into register stage 2 from the nonvolatile memory device and control 3. Note that the high frequency volatile segment of the circuit, block 2, is isolated from the low frequency, endurance limited nonvolatile segment of the circuit, block 3.

An illustrative circuit embodying the NMC functions is schematically depicted in FIG. 2 of the drawings. The circuit in FIG. 2 illustrates a CMOS embodiment fabricated with a single polysilicon layer. The schematic depicts the use of p-channel field effect transistors, such as M1, n-channel field effect transistors, such as M2, a positive voltage supply VDD of approximately +5 volts, ground nodes, a reference voltage node VREF, and programming/ground node shown symbolically by squares, which programming/ground node is normally maintained at ground potential but is pulled to −9 volts during the programming/writing of memory device in block 3 (FIG. 1).

The top portion of the diagram in FIG. 2 represents the serial-in serial-out shift register. Field effect transistors M1 and M2 pass the signals connected to the data in line in response to the clock signals (CK and CK/), the CL/signal being generated by inverter connected transistors M3 and M4. The latching of the data into the first section of the shift register is accomplished by transistors M7 and M8 providing in positive feedback form the signal from inverter M5 and M6 following inversion by M10 and M11, the inverters being responsive to reset/ and set/ signals on transistors M24 and M25. The second section of the shift register is connected to the first section by clocked pass transistors M12 and M13, which then in succession drive the buffer inverter set comprised of M16, M17, M18 and M19 and the inversely clocked latching feedback path provided by transistors M20 and M21. The nonvolatile segment of the NMC is connected to the shift register at nodes 4 and 6.

Note that the shift register is comprised exclusively of volatile devices, and as such is not subject to the frequency constraints imposed by the extended programming/writing pulses used to program/write the nonvolatile devices. As a corollary, the nonvolatile devices is also not exercised in its endurance capacity during shift register operation.

Field effect transistors M14, M27 and M28 provide the recall function to the NMC, by enabling the access transistor M14 and thereby connecting node 4 with floating gate sense transistor M15. At the time the recall/ function is initiated, node 4 is preconditioned to be at +5 volts in response to an immediately preceding set/ signal to transistor M25. The continuity of the +5 volts on node 4 is thereafter determined, during recall/, by the conductive state of floating gate sense transistor M15.

Transistors M26 and M32 pass through the bias voltage VREF, nominally +1 volts, to nodes 29 and 31. The bias voltage is coupled by capacitors C1 and C2 to floating gate electrode, node 30, to shift the gate voltage experienced by transistor M15 and thereby optimize its operating window. If the comination of the potential attributable to the charge on floating gate node 30 with the potential of VREF exceeds the threshold of floating gate sense field effect transistor M15, transistor M15 conducts in conjunction with M14 to pulled node 4 to a low voltage. In the alternative, if the previously written state represent by the charge on node 30 when combined with VREF is inadequate to enable transistor M15, node 4 remains at its high level. Thereby, the nonvolatile information is transferred from the memory device and control section to the volatile shift register stage. It should be recognized of that the use of a single sense transistor in combination with a recall set/cycle during a recall avoids the need for replicating the nonvolatile elements which would otherwise store the inverse of the nonvolatile data.

Transistor inverter pair M34 and M35 disable transistors M26 and M32 when the nonvolatile section is undergoing programming/writing. During such programming nodes 4 and 6 are respectively connected to nodes 29 and 31 via transistors M22 and M23. In this way, nodes 29 and 31 are connected to nodes 4 and 6 during programming/writing, yet are connected to bias voltage VREF during other times of the operating cycle.

It is worth noting that among other features of the circuit nodes 29 and 31 are held at voltage VREF during the changes of state within the volatile shift register section. Stability in the voltage coupled to the floating gate during dynamic variations the shift register section maximizes retention in the nonvolatile section of the NMC.

The transfer of change onto the nonvolatile floating gate electrode node 30 during programming/writing is accomplished by providing a program signal in substantial time coincidence with the provision of −9 volts VPP to the node designated by a square shaped symbol in the figure. These conditions produce a potential difference of 14 volts between nodes 29 and 31, across capacitors C1 and C2, in that the two nodes are connected to a respectively reversed sections of the shift register as represented by the voltages on nodes 4 and 6, wherein one of the nodes is at VDD, +5 volts, while the other node is drawn to the −9 volt VPP via appropriate transistor M6 or M11. As is described in the previously noted co-pending patent application, capacitor C1 is designed to be approximately 10 times larger than capacitor C2, providing when operated in the manner described above a distributed potential of approximately 14 volts across C2. With this potential across the capacitor C2, the thin floating gate tunneling dielectric which forms C2 conducts charge in the direction defined by the impressed potential to produce a net positive or negative trapped charge on floating gate node 30. Note that an extension of floating gate electrode node 30 is the gate electrode of sensing field effect transistor M15.

It should be appreciated that the described invention employs a division of programming/writing voltages which minimize the likelihood of dielectric breakdowns in very large scale integrated circuit devices. The selection of programming/writing voltages at +5 volts and −9 volts in conjunction with the conductive paths defined for each voltage ensure that active field effect devices are not subjected to stresses significantly in excess of 14 volts.

Figure 3:
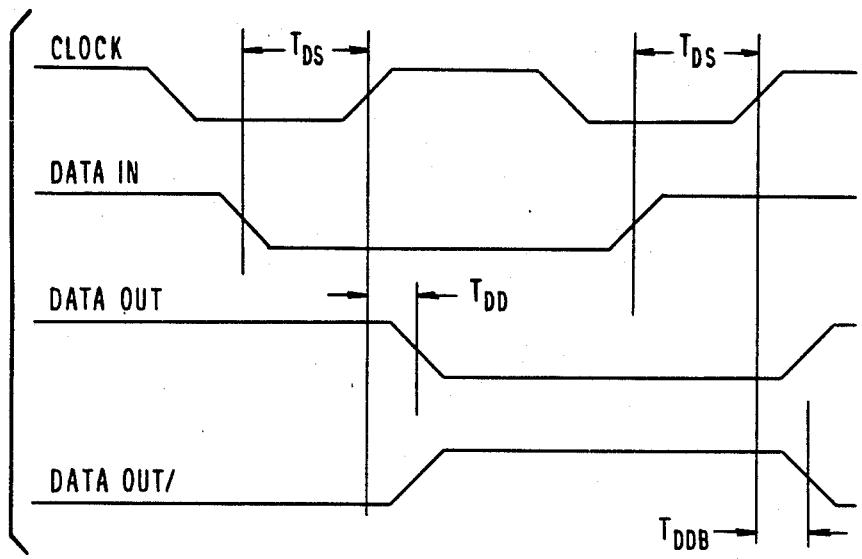
FIGS. 3-5 are representatives timing diagrams for the schematic in FIG. 2, relating the signals on the clock, data in, data out, set, program, high voltage and recall lines.
Figure 5:
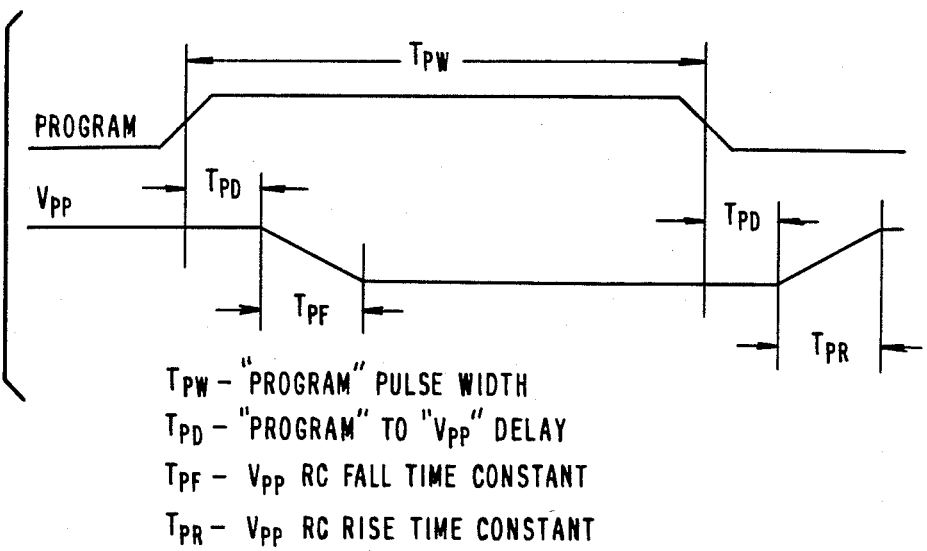
Figure 4:
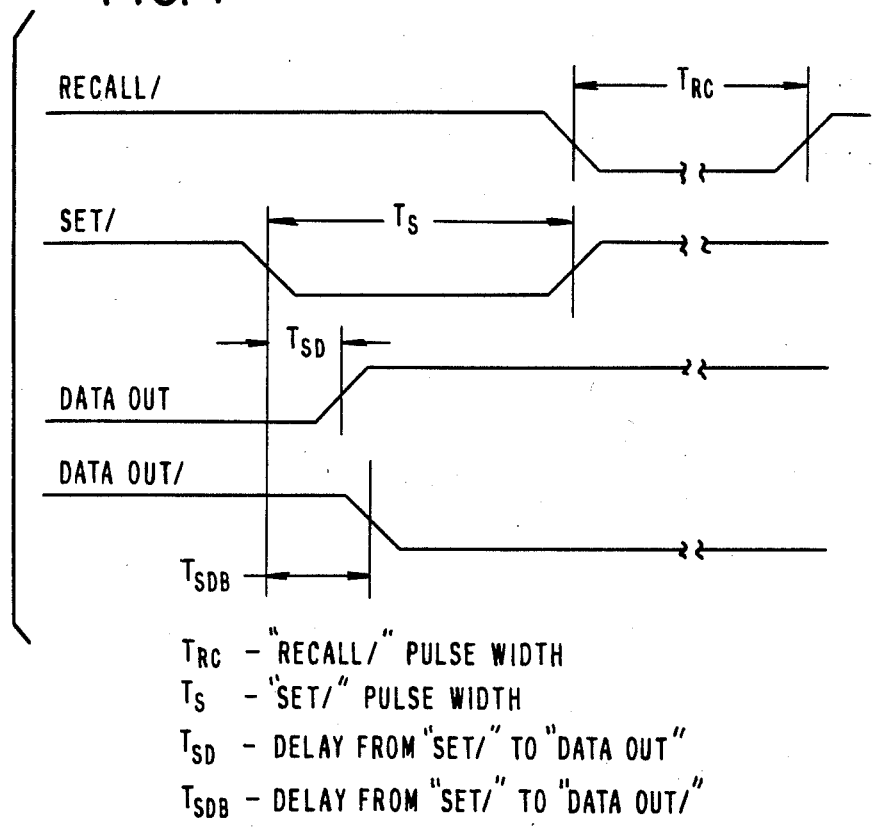

Representative signal timing relationships suitable to operate NMC 1 depict in FIG. 2 appear in FIGS. 3-5. FIG. 3 depicts the waveforms of the clock, the data in, and the data out line signals, from which waveforms it can be noted that the data in signal must remain valid during the data set up time following the negative transition of the clock. Note that data issuing at the output appears after the positive transition of the clock. A representative data set up time is 50 nanoseconds.

FIG. 4 depicts the timing relationship between the recall/, set/, and the data out line signals. A representative 20 nanoseconds set/pulse is used to precondition the volatile shift register prior to the recall of nonvolatile data. The duration of the recall/signal is nominally 50 nanoseconds, together providing a transfer of nonvolatile data into the shift register in significantly less than 100 nanoseconds. The time delay associated with recalling nonvolatile data can be further reduced by using a complementary pair of nonvolatile memory cells or a sense amplifier to drive the voltages on nodes 4 and 6.

The signals associated with programming/writing the NMC are depicted in FIG. 5. Note that the program node is normally held low, and according to preferred embodiment is brought high for approximately 10 milliseconds during the programming/writing operation. This waveform can be generated by a program voltage generator and control, such as 24 in FIG. 1, or can be provided by outside circuitry. The remaining programming signal is the −9 volts of VPP. This signal must also be present for approximately 10 milliseconds, and is further constrained by the requirement for a nominal 250 microsecond fall time and a nominal 10 microsecond rise time. The feature worth noting is that this signal is common to all NMCs undergoing concurrent programming. This allows a single circuit to control a multiplicity of NMCs.

The combination of volatile and nonvolatile capabilities in a single circuit provides the user with significant versatility as to the electronic functions which can be implemented. FIG. 1 illustrates the use of an NMC in combination with bidirectional analog switch 16 to relate the conductive state of switch 16 to the data in shift register stage 2. The data state in the shift register can be defined by clocked input data, or by a reset operation, or by a recall of formerly programmed nonvolatile data. The fundamental concepts can be extended in numerous ways. For example, FIG. 6 illustrates the interconnection of multiple NMCs to perform the function of a DIP switch, the corresponding analog switches of which are defined by shifted or recalled data. In a similar way, the switch states could be entered and thereafter stored for future recall. The multiple stage embodiment depicted in FIG. 6 can also be utilized in trimming resistor ladder networks, coding or decoding of encrypted data, setting of filter break points, controlling oscillator frequencies, and adjusting amplifier gain characteristics, among other applications. Note that nonvolatile programming is the sole low frequency operation.

Figure 7:
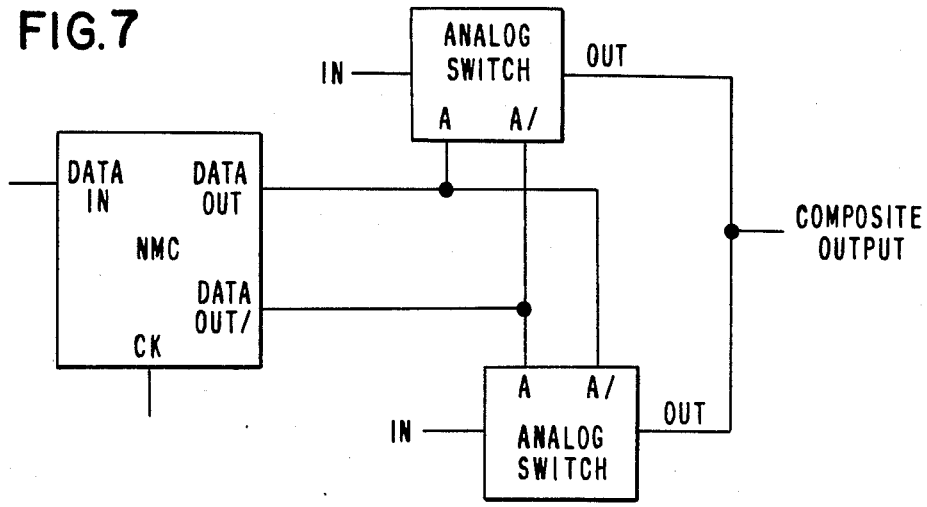
FIG. 7 schematically depicts a multiconfigurable circuit operable in conjunction with analog switches to perform the function of a single pole double throw switch.

A further varied application of the NMC is depicted in FIG. 7, where the outputs of the NMC are connected to the complementary inputs of two analog switches to create a single pole, double throw switch. Numerous other variations of such switching arrangements are also possible using NMCs, one further example being an integrated circuit equivalent of a rotary switch implemented by commonly connecting one output line from each of multiple analog switches. Again, the switch state information can be stored in nonvolatile form for later recall.

Figure 8:
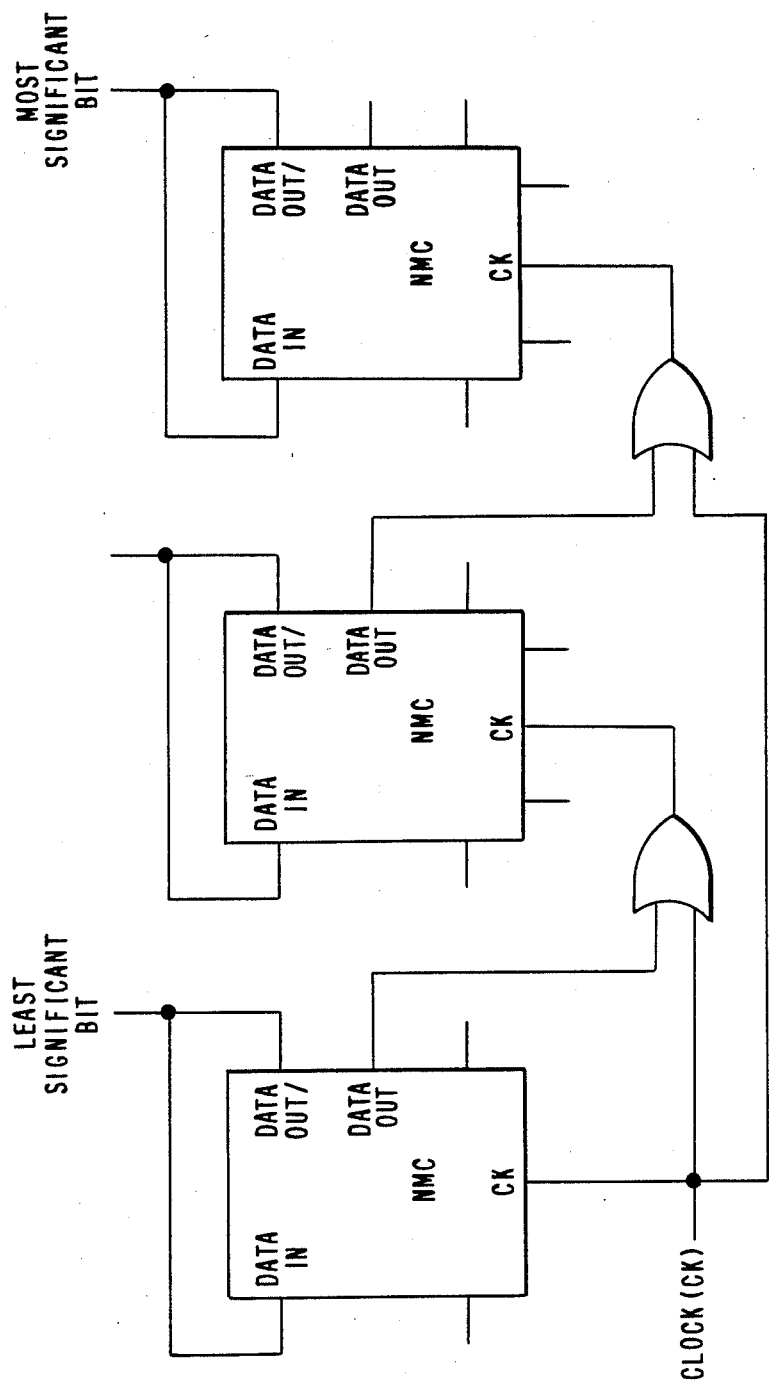
FIG. 8 schematically depicts a multiplicity of nonvolatile multiconfigurable circuits interconnected to perform the functions of a counter.

Further diverse embodiments utilizing an interconnection of multiple NMCs are presented in FIG. 8. The depicted arrangement illustrates the connection of three NMCs in conjunction with OR gates to create a 3 bit up counter. The down counter version of the arrangement can be implemented by taking the output from data out instead of data out/nodes for each NMC. Again, the nonvolatile feature provides for the storage and recall of the count.

With a understanding of the central features which characterize the present NMC invention, one can now more fully appreciate the attributes noted individually hereinbefore. For instance, the volatile shift register can be selectively set, set by a recall of the stored nonvolatile data, and operated at high frequency without affecting the stored nonvolatile data. The data in the shift register can, at any time, be transferred to nonvolatile storage with a single, direct write, programming operation. The use of a single polysilicon structure and low programming voltages allow inclusion of the circuit in contemporary integrated circuits, and particularly in semicustom designs configured from cell libraries.

What is claimed is:

1. A volatile/nonvolatile multiconfigurable integrated circuit comprising:
    a volatile shift register for storing binary state data and having data input, data output and clocking lines;
    means for nonvolatilely storing data representing a binary state from the volatile shift register, electronically connected to the volatile shift register and responsive to a selective program command; and
    means for setting the volatile shift register to a binary state from the means for nonvolatilely storing in response to a selective recall command, electronically connected both to the volatile shift register and to the means for nonvolatilely storing.

2. The apparatus recited in claim 1, wherein the means for nonvolatilely storing is a field effect transistor device configured with a single polysilicon electrode layer.

3. The apparatus recited in claim 1, further including a means for generating as a part of the selective program command a time and voltage controlled programming signal.

4. The apparatus recited in claim 3, wherein the volatile shift register includes a set line.

5. The apparatus recited in claim 4, further including a means for generating as a part of the selective recall command a time preceding preconditioning signal on the set line of the volatile shift register.

6. The apparatus recited in claim 1, further including a switch means for selectively electrically connecting first and second lines thereof in response to the binary state at the data output line of the volatile shift register.

7. A serial connection of multiple volatile/nonvolatile multiconfigurable integrated circuits as defined in claim 1, having the date output connection of a preceding circuit connected to the data input connection of the next succeeding circuit and the clock connections of the circuits connected and responsive to a common clock signal.

8. The apparatus recited in claim 7, wherein the multiple circuits are connected to be responsive to a common program command.

9. The apparatus recited in claim 7, wherein the multiple circuits are connected to be responsive to a common recall command.

10. A serial connection of multiple volatile/nonvolatile multiconfigurable integrated circuits as defined in claim 1, having at least two circuits with the data output lines of the circuits feeding back to the corresponding circuit data input lines, and having the block lines of the circuits connected through logic gates and responsive to a common clock signal.

11. The apparatus recited in claim 10, wherein the multiple circuits are connected to be responsive to a common program command.

12. The apparatus recited in claim 10, wherein the multiple circuits are connected to be responsive to a command recall command.

* * * * *